United States Patent [19]
Périot

[11] Patent Number: 5,058,391
[45] Date of Patent: Oct. 22, 1991

[54] METHOD OF COOLING ELECTRICAL COMPONENTS, DEVICE FOR IMPLEMENTING SAME AND APPLICATION TO VEHICLE-BORNE COMPONENTS

[75] Inventor: Robert Périot, Trevoux, France

[73] Assignee: GEC Alsthom SA, Paris, France

[21] Appl. No.: 515,916

[22] Filed: Apr. 27, 1990

[30] Foreign Application Priority Data

Apr. 27, 1989 [FR] France ................. 89 05603

[51] Int. Cl.$^5$ ............................................. F25B 27/00
[52] U.S. Cl. ................................. 62/238.6; 62/243; 62/323.1
[58] Field of Search ............... 62/238.6, 239, 243, 62/323.1

[56] References Cited

U.S. PATENT DOCUMENTS

| | | | |
|---|---|---|---|
| 3,721,104 | 3/1973 | Adler | 62/323.1 X |
| 3,918,270 | 11/1975 | Dixon et al. | 62/243 X |
| 3,989,099 | 11/1976 | Hosono et al. | 165/80 |
| 4,138,857 | 2/1979 | Dankowski | 62/243 X |
| 4,546,619 | 10/1985 | Rohner | 62/419 |
| 4,653,287 | 3/1987 | Martin, Jr. | 62/238.6 X |
| 4,873,839 | 10/1989 | Dessanti et al. | 62/238.6 |
| 4,918,945 | 4/1990 | Mucic | 62/238.6 X |

FOREIGN PATENT DOCUMENTS

| | | |
|---|---|---|
| 0047655 | 3/1982 | European Pat. Off. . |
| 0184146 | 6/1986 | European Pat. Off. . |
| 3704132 | 8/1988 | Fed. Rep. of Germany . |
| 2580060 | 10/1986 | France . |

*Primary Examiner*—Lloyd L. King
*Attorney, Agent, or Firm*—Sughrue, Mion, Zinn, Macpeak & Seas

[57] ABSTRACT

Method of cooling electrical components, especially electronic components, involving evacuation of the calories produced by said components (2) to an outside medium (5) via one or more thermal loops, whereby intermediate heat exchange steps are provided to
 transfer the calories produced by said electrical components directly or indirectly to the liquid coolant of a refrigerating machine,
 transfer the calories previously yielded to said liquid coolant to said outside medium (5) whose temperature may be higher than or equal to the operating temperature of said electrical components. An application to automotive vehicle-borne electrical components is described.

6 Claims, 1 Drawing Sheet

METHOD OF COOLING ELECTRICAL COMPONENTS, DEVICE FOR IMPLEMENTING SAME AND APPLICATION TO VEHICLE-BORNE COMPONENTS

The present invention concerns a method of cooling electrical components, a device for implementing the method and an application to components aboard a vehicle.

Electrical components, in particular electronic components such as diodes, transistors, triacs, thyristors and resistors, are employed in equipment which carries substantial power. These components are generally fixed upon a mounting base. Such equipment, even if it operates with good efficiency, transforms part of the electrical energy supplied to it into thermal energy which it is useful to evacuate in order to keep the components at a temperature compatible with their operation.

Several systems are known which in certain cases effectively permit the cooling of such components:
  direct, passive heat exchangers (heat sinks),
  circulation of cooling fluid with or without change of phase,
  heat pipes.

Such systems have been described, particularly in documents EP-A-0184146, U.S. Pat. No. 3989099, EP-A-0047655. The systems are essentially passive. In other words, the temperature decreases gradually and evenly from the hot source, this being the component in this case, to the cold source or external medium of heat exchange (often a heat sink). If this external medium has a temperature that varies substantially or if, more to the point, its temperature is higher than that at which the electrical components can operate, such systems are not satisfactory.

Also known are systems incorporating a refrigerating loop provided with an evaporator and a condenser. Thus, the patent application FR-A-2,580,060 describes a cooling device for electronic systems comprising several cooling assemblies, the condenser of each assembly being attached to a heat sink which is cooled by the surrounding air by means of a fan. The refrigerating power of each assembly again in this case depends directly on the temperature of the surrounding air; it follows that the sizing of the heat sink and the fan must both be planned accordingly.

Otherwise known are the automotive vehicle air conditioning systems described, in particular, in patent application DE-A-3,704,182. Such systems are effectively designed to ensure a constant temperature inside the vehicle passenger compartment, regardless of the temperature outside. They also comprise a heat sink and a fan which are sized for specified outside conditions.

An object of the present invention is therefore a method and device for cooling electrical components aboard an automotive vehicle the refrigerating power whereof does not depend on the outside temperature, this device not requiring a fan and including reduced-size means for cooling the condenser.

The method according to the invention of cooling electrical, especially electronic, components comprising the following operations:
  transfer of the calories produced by the components in a direct or indirect manner to the refrigerant fluid of a refrigerating loop by means of a first heat exchanger provided with an evaporator.
  transfer of the calories previously transferred to this refrigerant to an outside medium by means of a second heat exchanger provided with a condenser in contact with the outside medium, is characterized in that the outside medium is the liquid coolant of an internal combustion engine.

In one form of the invention, the cooling method for electrical components, especially electronic components, comprises the following operations:
  transfer of the calories produced by the stated electrical components to the coolant of a secondary circuit provided with a circulating pump, by means of an intermediate exchanger,
  transfer of the calories of the coolant from the secondary circuit to the refrigerant of the refrigerating loop via the first exchanger,
  transfer of the calories of the refrigerant from this refrigerating loop to the outside medium.

In another form of the invention, the method of cooling electrical components, in particular electronic components, comprises the following operations:
  transfer of the calories produced by the electrical components directly to the refrigerant of the refrigerating loop via the mounting base,
  transfer of the calories previously transferred to this refrigerant to the outside medium.

The invention also has as its object some devices for implementing the diverse variants of the method according to the invention.

The invention applies in particular to the cooling of electrical components which are carried aboard an automotive vehicle.

The different objects and characteristics of the invention will now be explained in greater detail in the description of examples of implementation given in a non-limiting capacity with reference to the appended drawing in which.

Elements common to the different figures have been given the same reference numerals.

Figure 1:
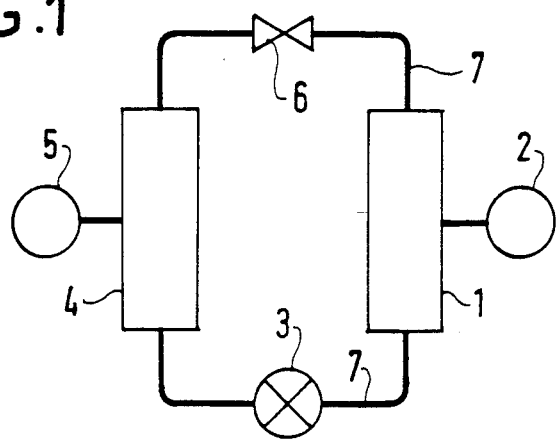
FIG. 1 is a diagram of a refrigerating machine of a known type.

A bried reminder will now be given of the operation of a known refrigerating machine, diagrammed in FIG. 1 and described particularly in the work on industrial refrigeration entitled "Réfrigération Industrielle de M. Conan-Eyrolles" which can be used in the context of the invention, it being understood that any other machine fulfilling the same function will serve the purpose. This machine comprises an evaporator 1 in direct or indirect thermal contact with the element 2 to be cooled, a compressor 3, a condenser 4 in thermal contact with an external medium 5 such as to yield calories thereto, a pressure reducing valve 6, all of which sub-assemblies are connected together by pipes 7 in which a refrigerant fluid flows. The operating cycle of such a vapor compressing machine is as follows:
  evaporation of the fluid in a first heat exchanger 1 at a temperatue T1 by the acquisition of calories coming from the element 2 to be cooled,
  compression of this vapor, bringing about its heating to a temperature T2, cooling and condensing of this vapor in a second heat exchanger 4, whereby calories are yielded to the outside medium 5, sub-cooling in liquid phase to temperature T3, expansion of this liquid thanks to the pressure reducer 6 accompanied by cooling and return to the evaporator 1.

In the context of the invention, T1 is the operating temperature of the electrical components, which is less than T3, the temperature which can be assumed to be equal to that of what we will term by convention the outside medium, T3 being less than T2.

The inventive method of cooling electrical components will now be described more specifically. It should be clear that the present description also concerns the devices making it possible to implement the method according to the invention.

In the present invention, the method for cooling electrical components relies upon a thermodynamic cycle such as the one occurring in the refrigerating machine described hereinabove. One operation common to the different variants consists in cooling an element 2 which is either a liquid coolant conveying calories generated by electrical components, or said electrical components themselves, or their mounting bases.

Figure 2:
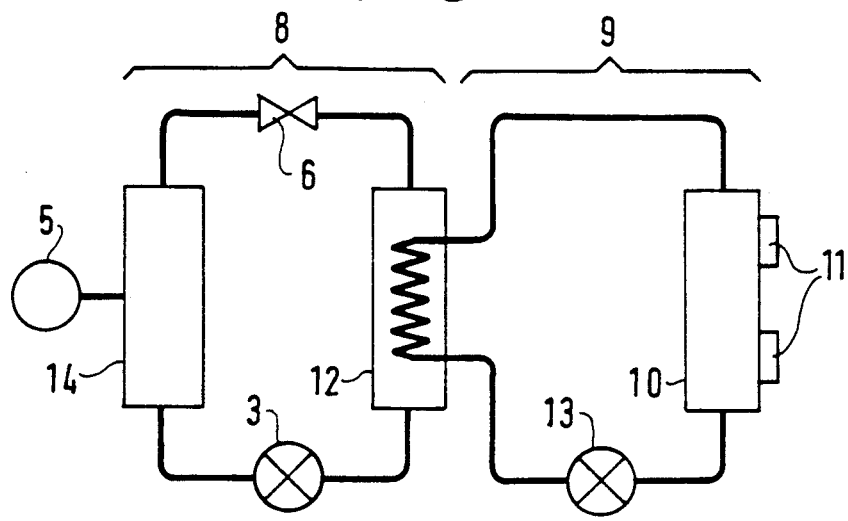
FIG. 2 is a diagram of a cooling device for electrical components according to the invention.

In a first form of the invention represented in FIG. 2, the cooling method relies on two thermal loops: a refrigerating loop 8 and a secondary circuit 9.

The method includes, in particular, the following operations:

transfer of the calories from the electrical components 11 or their mounting bases to the fluid of the secondary circuit 9 within the exchanger 10;

circulation of the fluid of the secondary circuit 9 with the circulation pump 13;

transfer of the calories from the fluid of the secondary circuit 9 to the refrigerant of the refrigerating loop 8 within an exchanger 12 common to the two thermal loops, an exchanger which includes the evaporator of said refrigerating loop;

transfer of the calories of the refrigerant of the refrigerating loop 8 to the outside medium 5 within the exchanger 14 which includes the condenser of this refrigerating loop.

This method indeed makes it possible to cool the electrical components or their mounting bases by yielding the calories which they generate to an outside medium at a higher temperature.

Figure 3:
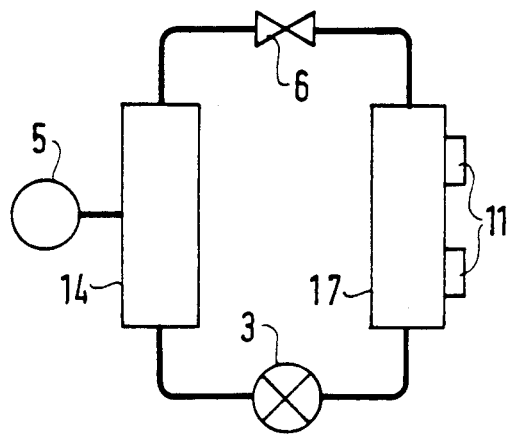
FIG. 3 is a diagram of another cooling device for electrical components according to the invention.

In another form of the invention represented in FIG. 3, the cooling method relies on a single thermal loop, this being a refrigerating loop. This method in particular comprises the following operations:

transfer of the calories of the electrical components 11 or of their mounting bases with the refrigerant of the refrigerating loop within the exchanger 17 which constitutes the evaporator of this refrigerating loop, transfer of the calories of the refrigerant of the refrigerating loop to the outside medium 21 within the exchanger 14 which includes the condenser of this refrigerating loop.

The advantage of this alternative resides in the use of a single thermal loop. The corresponding device is therefore simpler to implement because it has fewer elements.

Figure 4:
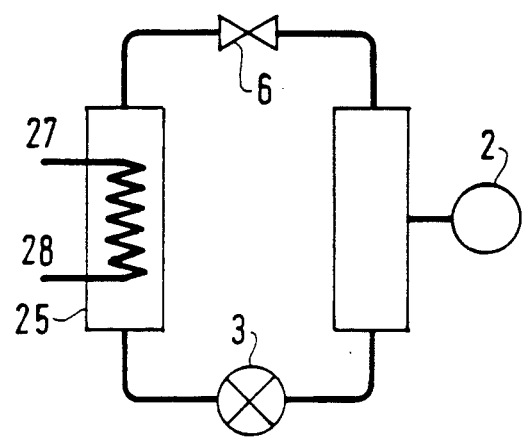
FIG. 4 is a diagram of a third cooling device for electrical components according to the invention.

In a third form of the invention represented in FIG. 4, the same considerations as before apply. In addition, the transfer of the calories of the refrigerant of the refrigerating loop takes place within an exchanger 25 where the outside medium is the cooling liquid of an internal combustion engine which flows through this exchanger thanks to two access ports 27, 28 from internal combustion engine 30 of an automotive vehicle 31 leading to coil 29 of heat exchanger 25.

To take a concrete example, the electrical components operate at a temperature of the order of 50° C. whereas the coolant can see its temperature increase to up to 100° C. or 110° C.

The invention in one form of application of the method, allows, by the use particularly of a refrigeration cycle, the cooling of electronic components carried aboard an automotive vehicle.

Obviously, the preceding descriptions are given by way of example. Other variants may be envisaged without departing from the context of the invention.

I claim:

1. A method for cooling electrical components within an automotive vehicle including an internal combustion engine cooled by a liquid coolant, said electrical components carrying substantial electrical power and generating large amounts of heat, said method comprising the following steps:

transferring heat produced by said components (2), in a direct or indirect manner, to the refrigerant of a refrigerating loop (8) by means of a first heat exchanger (1, 12) provided with an evaporator, and transferring the heat previously yielded to said refrigerant to the coolant of the internal combustion engine (30) by means of a second heat exchanger (4, 14, 25) provided with a condenser in contact with the internal combustion engine liquid coolant; whereby said automotive vehicle electrical components are cooled by extracting heat therefrom to the liquid coolant of the internal combustion engine at a higher temperature, and wherein said cooling method operates irrespective of the ambient temperature outside of the automotive vehicle.

2. Method for cooling electrical components of an automotive vehicle, according to claim 1, wherein heat produced by said electrical components (11) is transferred to the liquid coolant of a secondary circuit (9) provided with a circulating pump (13), by means of an intervening heat exchanger (10), heat is transferred from the liquid coolant of the secondary refrigeration circuit to the refrigerant of the refrigerating loop (8) via said first heat exchanger, and heat is transferred from the refrigerant of said refrigerating loop to said coolant of said internal combustion engine (30).

3. Method for cooling electrical components of an automotive vehicle, according to claim 1, wherein heat produced by said electrical components (11) is transferred directly to the refrigerant of said refrigerating loop (8) via a mounting base operatively coupled to refrigerating loop (8) and supporting directly said electrical components (11), and heat is transferred from said refrigerant in the refrigerating loop to said liquid coolant of said internal combustion engine (30).

4. A system for cooling electrical components (11) of an automotive vehicle including an internal combustion engine cooled by a liquid coolant at a higher temperature than the temperature of the electrical components (11), said system comprising a refrigeration loop (8) provided with a first heat exchanger (1, 12) incorporating an evaporator receiving heat generated by said electrical components, a second heat exchanger (14) incorporating a condenser in thermal contact with said liquid coolant of said internal combustion engine (30), whereby said automotive vehicle electrical components are cooled by extracting heat therefrom to the liquid coolant of said internal combustion engine at a higher temperature and irrespective of the ambient temperature outside the vehicle thereby eliminating the need for a fan while reducing the size of the condenser in thermal contact with the automotive vehicle internal combustion engine liquid coolant.

5. System for cooling electrical components of an automotive vehicle, according to claim 4, further comprising:
  a first intermediate heat exchanger (10) for transferring heat from said electrical components (11) to a liquid coolant of a secondary circuit (9), and wherein said first heat exchanger (12) is operatively coupled to the secondary circuit for transferring the heat of the coolant of the secondary circuit to the refrigerant of said refrigerating loop (8).

6. System for cooling electrical component of said automotive vehicle, according to claim 4, wherein said electrical components (11) are mounted on said first heat exchanger (1, 12) for direct transfer of heat to said first heat exchanger.

* * * * *